United States Patent
Han et al.

(10) Patent No.: US 9,598,765 B2
(45) Date of Patent: Mar. 21, 2017

(54) TOUCH SURFACE FOR AN ELECTRONIC DEVICE AND METHOD FOR MANUFACTURING THE SAME

(71) Applicant: Logitech Europe S.A., Lausanne (CH)

(72) Inventors: Zhaoyang Han, Epalinges (CH); Chienchung Chen, Hsinchu (TW); Ken Delaney, County Cork (IE); Changliang Li, Suzhou (CN); Xiaoling Liu, Suzhou (CN); Jianqing Hu, Suzhou (CN); Wei Han Liao, Hsingchu County (TW); Tsu Hsien Lee, Hsingchu County (TW); Yi Ling Cai, Taichung County (TW); Jacques Robert, Lausanne (CH); Stephen Harvey, County Cork (IE)

(73) Assignee: Logitech Europe S.A., Lausanne (CH)

( * ) Notice: Subject to any disclaimer, the term of this patent is extended or adjusted under 35 U.S.C. 154(b) by 131 days.

(21) Appl. No.: 14/320,144

(22) Filed: Jun. 30, 2014

(65) Prior Publication Data
US 2015/0055030 A1  Feb. 26, 2015

Related U.S. Application Data

(63) Continuation of application No. PCT/CN2013/082248, filed on Aug. 26, 2013.

(51) Int. Cl.
*G06F 1/16* (2006.01)
*C23C 16/27* (2006.01)
(Continued)

(52) U.S. Cl.
CPC .......... *C23C 16/27* (2013.01); *C23C 14/0605* (2013.01); *C23C 16/30* (2013.01); *G06F 3/041* (2013.01); *G06F 2203/04103* (2013.01)

(58) Field of Classification Search
CPC combination set(s) only.
See application file for complete search history.

(56) References Cited

U.S. PATENT DOCUMENTS

| | | | |
|---|---|---|---|
| 2003/0175527 A1* | 9/2003 | Lingle | C03C 17/36 428/426 |
| 2004/0263717 A1* | 12/2004 | Hsu | G02B 6/0036 349/62 |

(Continued)

FOREIGN PATENT DOCUMENTS

| CN | 101403800 A | 4/2009 |
|---|---|---|
| CN | 103232171 A | 8/2013 |

OTHER PUBLICATIONS

International Search Report and Written Opinion for International PCT Application No. PCT/CN2013/082248, mailed Jun. 4, 2014, 12 pages.

*Primary Examiner* — Van Chow
(74) *Attorney, Agent, or Firm* — Kilpatrick Townsend & Stockton LLP

(57) ABSTRACT

Embodiments provide a touch surface that can be integrated into an electronic device. User input can be received via the touch surface (e.g., a touchscreen, a key cap). The touch surface can include a substrate, a rigid layer for maintaining the contours of the substrate, and a surface layer deposited over the rigid layer for adjusting the surface energy of the touch surface. The substrate can be made with plastic; the rigid layer can be a diamond-like carbon (DLC) coating; and the surface layer can be comprised of fluoro- or silicon-rich molecules. The DLC can be deposited over the plastic substrate via physical vapor deposition (PVD) while the surface layer can be deposited over the DLC via a chemical vapor deposition (CVD). The touch surface can be constructed using different layers of material and using different (Continued)

methods to improve the longevity of the touch surface against repeated use and wear.

20 Claims, 11 Drawing Sheets

(51) Int. Cl.
*G06F 3/041* (2006.01)
*C23C 14/06* (2006.01)
*C23C 16/30* (2006.01)

(56) References Cited

U.S. PATENT DOCUMENTS

| | | | |
|---|---|---|---|
| 2006/0014111 A1* | 1/2006 | Goto | G03C 1/49845 430/348 |
| 2009/0167703 A1* | 7/2009 | You | G02F 1/13338 345/173 |
| 2010/0261313 A1* | 10/2010 | Toh | H01L 21/561 438/109 |
| 2011/0170253 A1* | 7/2011 | Liu | G06F 3/0428 361/679.22 |
| 2011/0203468 A1* | 8/2011 | Harada | B41C 1/05 101/375 |
| 2013/0044082 A1* | 2/2013 | Lin | H01J 9/24 345/175 |
| 2015/0169110 A1* | 6/2015 | Nah | G06F 3/044 345/174 |

\* cited by examiner

TOUCH SURFACE FOR AN ELECTRONIC DEVICE AND METHOD FOR MANUFACTURING THE SAME

CROSS-REFERENCES TO RELATED APPLICATIONS

The present application is a bypass continuation of PCT Application No. PCT/CN2013/082248, filed Aug. 26, 2013, the disclosure of which is herein incorporated by reference in its entirety for all purposes.

BACKGROUND

Embodiments of the present invention relate generally to a touch surface, and in particular to a touch surface that can be part of an electronic device.

People are increasingly relying on electronic devices for a variety of tasks. As the capabilities of various electronic devices increase, and as people are using their electronic devices more frequently, there are additional challenges being faced in meeting user expectations. For example, it would be desirable to spare the users of the electronic devices from having to constantly handle their electronic devices with extreme care. Conventional devices often include brittle materials that can be damaged or even shattered upon impact, which can often render the devices unusable. Due to the fragility of the various electronic devices, there are limitations on the manner in which users can handle their electronic devices.

SUMMARY

Various embodiments provide a touch surface (also referred to as touch panel hereinafter) that permits a user to glide his or her finger across the touch surface and receive a similar feeling to gliding the finger across the surface of a touch panel made with glass. In some embodiments, the touch panel can include a plastic substrate, a layer of diamond-like carbon (DLC) coating, and a surface layer. The plastic substrate can have a surface topography including a number of round-shaped protrusions, which provides a level of texture roughness against the touch of a fingertip. The layer of diamond-like carbon can serve to minimize wear against the shape of the plastic substrate and to maintain its surface topography. The surface layer can modify the surface energy in some embodiments. The surface layer or additional layers over the surface layer of the touch panel can provide additional anti-fingerprint or anti-glare capabilities.

Some embodiments can manufacture a touch panel by creating a plastic substrate. The plastic substrate can be created by an injection molding process where a partially liquid substance (e.g., molten or melting plastic) can be injected into a molding tool. The formed substrate can include a number of round-shaped protrusions on one surface, as described above. In some embodiments, a physical vapor deposition (PVD) process can be used to deposit a layer of DLC over the surface of the formed substrate. In certain embodiments, a surface layer can be chemically bonded to the DLC layer by using a chemical vapor deposition (CVD) process. The surface layer can include low surface energy fluoro-/silicon rich molecules that can reduce the surface energy of the touch panel. Various embodiments described herein can provide an efficient and cost-effective process for assembling the touch panel.

Certain embodiments provide a touch surface that can be part of an electronic device. In some embodiments, the touch surface can be used as a touchscreen panel that is provided on at least one side of the electronic device. In another embodiment, the touch surface can be incorporated into key caps on a keyboard such that the portion of the key cap that is contacted by the user's finger can be made with the touch surface. In one embodiment, the touch surface can be part of a track pad or any other touch device that can receive input commands via a user's touch or gestures. Embodiments described herein provide a touch surface that can be integrated into various electronic devices and receive user input directed at the devices.

A further understanding of the nature and advantages of embodiments of the present invention may be realized by reference to the remaining portions of the specification and drawings.

10B illustrates a back view of an example electronic device that can be used in accordance with various embodiments.

Figure 11:
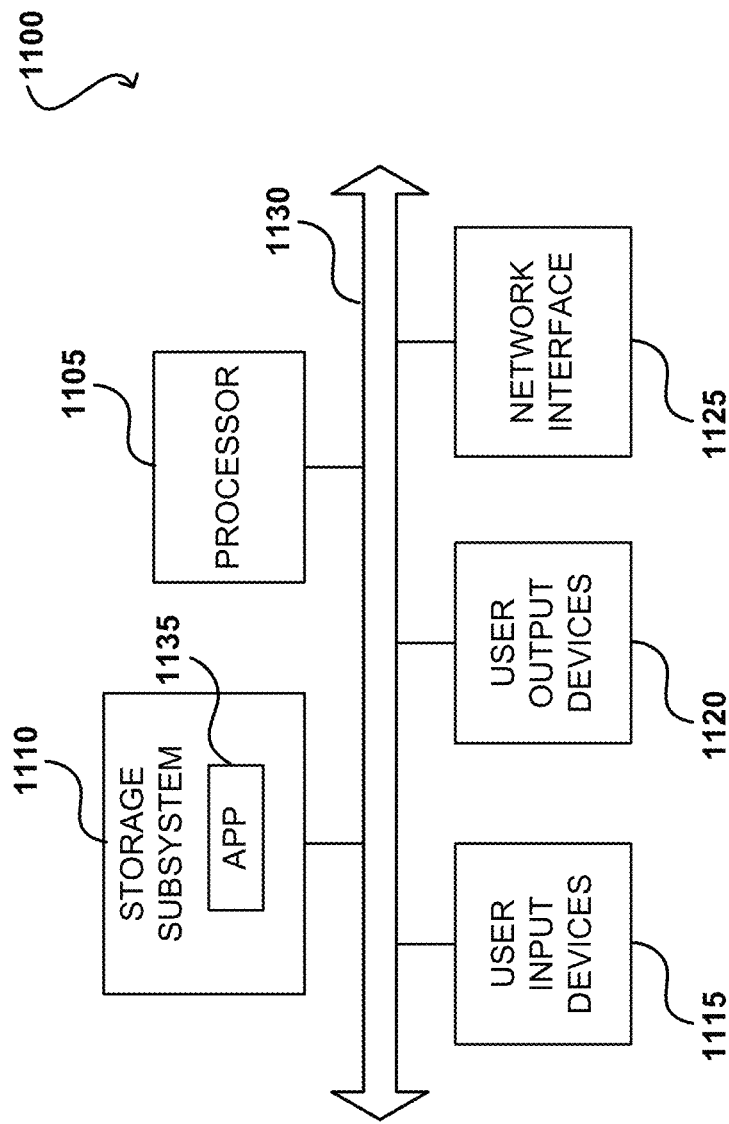

FIG. 11 illustrates a set of components that can be incorporated into exemplary system according to some embodiments.

Figure 12A:
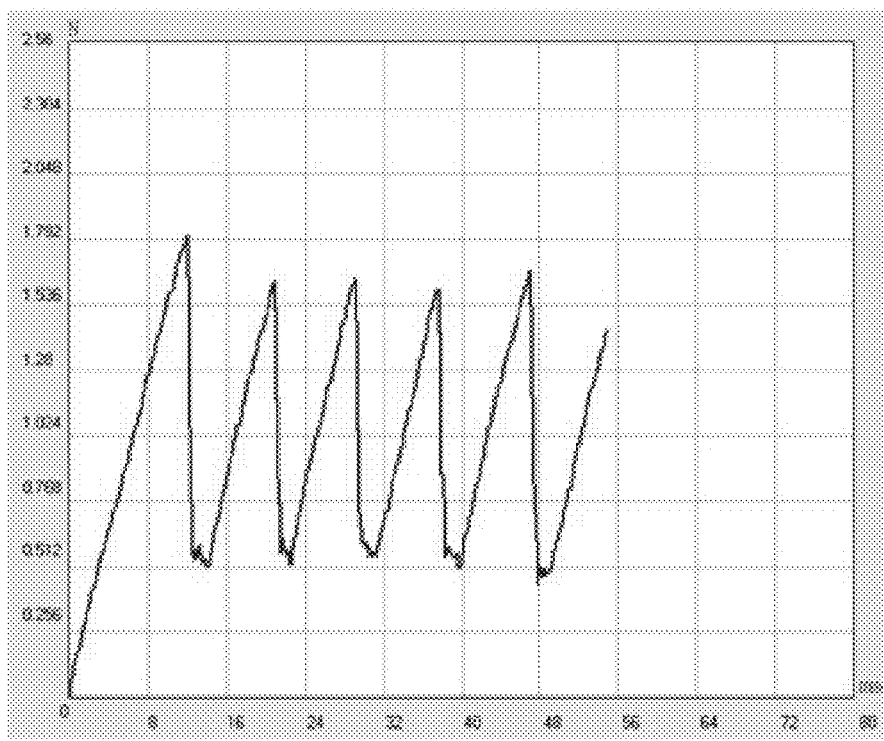

FIG. 12A illustrates the friction profile of a sample without DLC coating according to some embodiments.

Figure 12B:
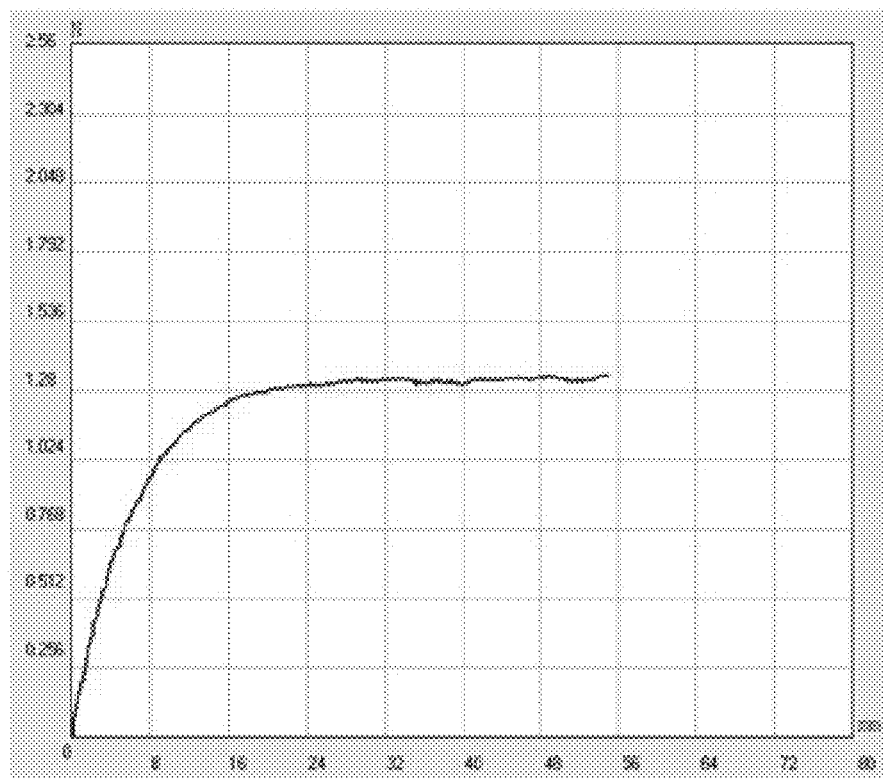

FIG. 12B illustrates the friction profile of sample with DLC coating according to some embodiments.

DETAILED DESCRIPTION

In the following description, for the purposes of explanation, numerous details are set forth in order to provide an understanding of various embodiments of the present invention. It will be apparent, however, to one skilled in the art that certain embodiments can be practiced without some of these details.

Systems and methods in accordance with various embodiments of the present disclosure may overcome one or more of the aforementioned and other deficiencies experienced in conventional approaches to enabling a user to interact with a system, device, interface, or other such object in an electronic environment. Various embodiments provide a touch surface (also referred to as touch panel, touch-sensitive surface, or touch-enabled surface interchangeably hereinafter) that can be incorporated into an electronic device. In some embodiments, the touch panel can include a plastic substrate, a layer of diamond-like carbon (DLC), and a surface layer. The plastic substrate can have a surface topography including a number of round-shaped protrusions, which can provide a level of texture roughness against the touch of a fingertip. A thin layer of DLC can be deposited over the plastic substrate to minimize abrasive wear and thereby maintain the profile of the plastic substrate. Some embodiments may further include a surface layer over the DLC layer. The surface layer can be a fluoro- or silicon-rich coating that can be used to adjust the surface energy of the touch panel and thereby enhance the user's touch experience when the finger glides or touches against the surface of the touch panel.

The touch panel can be assembled in various ways. Some embodiments may create a substrate or a foundation by an injection molding process. In such embodiments, material can be injected into a molding tool to form a molded substrate. In certain embodiments, the molding tool can be designed and constructed in a way such that the formed substrate has a number of round-shaped protrusions on one surface of the substrate. Some embodiments may then use physical vapor deposition (PVD) to apply a thin coating of DLC over the surface of the formed substrate. The hardness and rigidity of the DLC layer provides protection to the formed substrate against deformation from abrasive wear. In some embodiments, a surface layer can be chemically bonded to the DLC layer via a chemical vapor deposition (CVD) process. The surface layer can include fluoro- and/or silicon-rich molecules (e.g., fluorinated or silicone polymers) that can lower the surface energy on the surface of the touch panel. In some embodiments, the touch panel can include additional layers over the surface layer to provide anti-fingerprint capability, anti-fog capability, anti-glare capability, or any other types of capabilities that may be useful for a touch surface.

A touch panel can be defined as an object that has one or more layers of material assembled to form a surface. In some embodiments, the touch panel can be incorporated into an electronic device. The touch panel can be gesture-sensitive or touch-enabled such that user input can be received via the touch panel and translated into commands. The touch panel can be in any shape or form. For example, the touch panel can be rectangular-shaped and incorporated into smartphone or tablet devices as the touchscreen of the devices. In another example, the touch panel can be square-shaped with rounded-edges and can be incorporated into the edge of key caps where the user's fingers come in contact. In yet another example, the touch panel can have a curvature similar to the portion of a computer mouse where the hand contacts the computer mouse.

Embodiments described herein can use a plastic substrate to construct a touch panel that feels and looks similar to a touch panel constructed using a glass substrate, while having the added benefit of being less brittle, more durable, and with improved clarity and transparency. For example, plastic tends to have a higher refractive index than glass, thereby providing better clarity and transparency compared to glass. In some embodiments, the touch panel can be integrated into an object such as an electronic device, with a surface of the touch panel being on the exterior portion of the electronic device. The durability of the touch panel may thereby serve to protect the device and its internal components against external impact.

Figure 1:
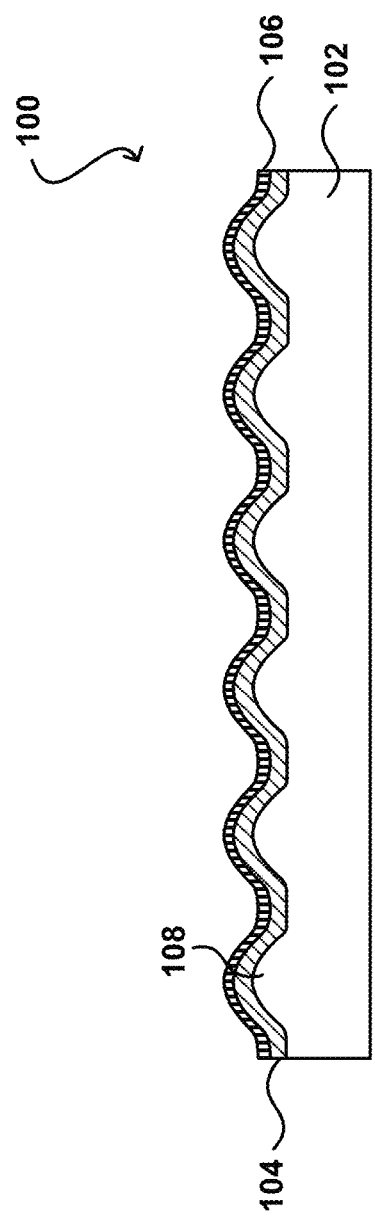
FIG. 1 illustrates a cross-sectional view of a touch panel according to some embodiments of the present invention.

FIG. 1 illustrates a cross-sectional view of a touch panel 100 in accordance with some embodiments. Touch panel 100 can be part of an electronic device such as a mobile phone, a tablet computer, a monitor, a keyboard, a trackpad, and the like, that includes a surface via which user input can be received. In one example, touch panel 100 can be incorporated into a smartphone device as the touchscreen that displays images and receives user input. In another example, touch panel 100 can be incorporated into key caps on a keyboard as the surface where the fingers are contacted during keyboard input. Different embodiments may incorporate additional or fewer layers and/or different compositions in the material that forms the layers when assembling a touch panel compared to those described in this example.

As shown in FIG. 1, touch panel 100 can include a substrate layer 102, a DLC layer 104, and a surface layer 106. Touch panel 100 in some embodiments may include additional or fewer layers of material compared to that shown in FIG. 1. In one example instance, an additional binder layer can be added (e.g., between substrate layer 102 and DLC layer 104) to facilitate the bonding or strengthen the bond between different layers of touch panel 100. In another example, an additional hardening layer can be added on top of substrate layer 102 to reinforce the surface profile of substrate layer 102. In yet other examples, self textured structure (e.g., superposed onto the primary texture), high refractive index material, ultraviolet (UV) coatings, ceramic coatings (applied via spray coating, sputtering, and other metalizing methods), etc. can form one or more of the layers of material that are part of the touch surface.

In some embodiments, substrate 102 of touch panel 100 can be made from plastic or a combination of plastic and other materials. The plastic material can include different types of plastic including, but not limited to, polyethylene, polypropylene, polyvinyl chloride, polytetrafluoroethylene (PTFE), etc. Other types of material may also be used in creating the substrate in some embodiments. Some embodiments can assemble a touch panel using a plastic substrate where the touch panel feels the same or similar to a touch panel assembled using a glass substrate. In certain embodiments, other types of non-conducting material aside from plastic can be used to construct substrate 102. Substrate 102 in some embodiments can be comprised of any moldable material that can produce a three-dimensional shape.

Substrate 102 can have a surface topography that includes several rounded protrusions 108 on one side of substrate 102. In one embodiment, rounded protrusions 108 can include peaks of smooth, round shapes. Instead of rounded protrusions, some embodiments may provide protrusions in other types of shapes, including pyramids, cylinders, trapezoids, ball shapes, or any regular or irregular geometric shape with partially rounded edges. In some embodiments, protrusions 108 can be evenly distributed across the one side of substrate 102. In one embodiment, the in-plain pitch (i.e., the distance between the centers of two protrusions 108) can range from 1 μm-100 μm. The roughness of the texture of the plastic substrate can be adjusted based at least in part on the peak-to-valley ratio of the protrusions. In some embodiments, a texture roughness Ra value ranging from 0.1 μm-2.5 μm is the desired range that provides the user a smooth and easy glide surface when the finger is dragged across touch panel 100.

As described, the substrate may include a number of protrusions on at least one surface of the substrate. A protrusion can describe any sort of relative difference in height on the surface. The one or more protrusions on a surface of the substrate can be formed in various ways, for example, by introducing a gap on the surface, by introducing an indentation on the surface, by introducing any kind of unevenness across the surface, by introducing a bump over the surface, by introducing a ridge across the surface. Multiple protrusions can be present on the surface of the substrate and the different protrusions can be formed in different ways. The formed protrusions across the surface can be in a regular or irregular pattern.

Some embodiments provide a uniform layer of binder layer (not shown in FIG. 1) over plastic substrate 102. In some embodiments, the binder layer can serve to enhance the cohesiveness between plastic substrate 102 and another layer such as a DLC layer. Suitable elements for acting as a binder layer (also referred to as binding layer, bridging layer, or sometimes buffer layer) can include elements of the IV-VII group, particularly Ti, Cr, and W, which are easy to form carbides. Other elements, such as Mo, Nb, Pt, Au, Ag, Cu, Si, and their derivatives (e.g., TiN, TiC, etc.) can also be used as the binder layer or can also be used in forming the binder layer.

The binder layer can be made from a specific type of material with a solubility parameter and polarity that can bridge the gap between organic (e.g., plastic) and inorganic layers (e.g., DLC). Plastic can be organic and the DLC layer can be inorganic. As such, there can be internal stress between the DLC layer and the plastic layer when layered over each other, which may lead to the peeling of the DLC film. For the purposes of increasing adhesion and reducing internal stress, an additional binder layer can be used between the organic layer (e.g., the plastic layer) and the inorganic layer (e.g., the DLC layer). Other ways to reduce the stresses between the DLC film and the plastic substrate can include depositing multiple layers of DLC, create a gradual change of polarity and/or the solubility parameters of the DLC from something similar to plastic's to pure $SP_3$ inorganic, and/or doping metal into the DLC to minimize stress by increasing flexibility/tactility of the layer.

In some embodiments, the binder layer can be deposited over plastic substrate 102 via a physical vapor deposition (PVD) process. The binder layer can also be deposited via different means other than PVD, such as via dip-coating, via spray coating, aerosol, printing, etc. In one embodiment, the binder layer can have a Ra value that is less than half the Ra value of plastic substrate 102. In some embodiments, the desired thickness of the binder layer is between 10 nm-500 nm.

In some embodiments, the binder layer may not be included in the construction of the touch surface. In some such embodiments, the film quality and the reliability may be reduced. The DLC film can be deposited over the substrate by simply coating a low surface energy coating (e.g., Teflon layer) that would keep the surface smooth and provide a nice gliding for the touch movement.

As shown in FIG. 1, touch panel 100 includes a layer of DLC 104 over substrate 102. Properties of a DLC coating include a low coefficient of friction and high micro-hardness, making it effective in minimizing abrasive wear against the surface of the object over which the DLC is coated. The rigidity of DLC layer 104 can serve as protection against distortion of substrate layer 102 underneath and thus preserve the topography of substrate layer 102. DLC provides good stain-resistance characteristics and prevents the fast deterioration of plastic surface textures caused by moisture, grease, hand cream, stains, etc. Incorporating the DLC layer improves the anti-fingerprint effect due to the higher liquid contact angle property in the DLC layer (e.g., water contact angle>95°). The DLC layer can also create great gliding over plastic because of its minimized electron interactions (i.e., due to the small atomic radius and close packing, gas adsorption, and fewer unpaired electrons).

DLC 106 can be deposited over substrate 102 via a PVD process. In embodiments where a binder layer is deposited over plastic substrate 102, a thin, uniform layer of DLC 104 can be deposited over the binder layer that is on top of plastic substrate 102. In certain embodiments, the desired thickness of DLC layer 104 can be between 10 nm-500 nm thick. The DLC layer can have a film thickness below a threshold value (e.g., below the wavelength of light in air) such that the transmissive properties through the layer are unaffected or minimally affected. Certain embodiments may use other types of material that are chemically stable and that also possesses a similar hardness as DLC.

Touch panel 100 can include a surface layer 106 deposited over DLC layer 104. Surface layer 106 is a chemical layer that can be used to adjust the surface energy level. In some embodiments, surface layer 106 can include fluoro- or silicon-rich molecules (e.g., fluorinated carbon, silicon). When the surface layer is fluorinated, the surface energy is lowered and the attraction/repellant forces are reduced due to the lipophobic nature of fluorine. Fluorine can reduce polarizability, reduce the surface energy, and reduce the coefficient of friction.

In some embodiments, the desired surface energy level can be adjusted based on the percentage of fluoro- or silicon-rich molecules per unit area. The higher the percentage of fluoro- or silicon-rich molecules per unit area, the lower the surface energy level. In some embodiments, the surface energy of surface layer 106 can be lessened (e.g., by increasing the percentage of fluorine or silicon per unit area) to produce a good gliding feeling against the finger when the finger is brushed against the surface of touch panel 100.

In some embodiments, surface layer 106 can be chemically bonded against DLC layer 104 e.g., via a CVD process. The chemical bond ensures that surface layer 106 is difficult to wear off. In some embodiments, the covalent bonding between the DLC layer and the surface layer provides a stronger bond than if the surface layer were to be disposed directly over the plastic substrate. The composition of the DLC layer permits the strong chemical bonding against the surface layer. Only a thin layer of surface layer 106 (e.g., Teflon coating) is needed due to the chemical bond between surface layer 106 and DLC layer 104.

Surface layer 106 can be a thin, uniform layer deposited over DLC layer 104 such that it tracks to the roughness of the profile underneath. In some embodiments, the desired thickness for surface layer 106 can be between 1 nm-100 nm. In certain embodiments, touch panel 100 may not include a DLC layer, but instead just have surface layer 108 directly deposited over plastic substrate 102. The DLC layer and the surface layer can be laid over the substrate in a manner that closely tracks the contours of the plastic substrate and that reduces the profile roughness parameter of the substrate minimally (e.g., less than a threshold value).

In some embodiments, the Ra value of the surface layer and the DLC layer can be substantially equal to the Ra value of the substrate. The amount or percentage of Ra that is reduced may depend on the thickness of the DLC layer and of the surface layer. For example, the thickness of a surface layer deposited touch pad can be around 15 nm, which may not affect the Ra value. For a film thickness below 100 nm, the reduction of the Ra value may be small enough such that the overall roughness could be regarded as the same. In some embodiments, the Ra value may be reduced by the DLC from 0 to 0.5 μm. The Rz value may be reduced by the DLC from 0 to 1 μm.

Some embodiments may include fewer layers compared to that shown in exemplary embodiment 100 in FIG. 1. The touch surface in some embodiments may not include a DLC layer or a surface layer. In certain embodiments, a smooth plastic substrate may be used instead of one with protrusions. In such embodiments, a binder layer that has a surface texture with a roughness average between 0.1 μm-2.5 μm may be deposited over the smooth plastic substrate. Some embodiments may then subsequently deposit a DLC layer and a surface layer over the binder layer.

Various embodiments may include additional layers deposited over and between the multiple layers shown in exemplary embodiment 100 in FIG. 1. Additional layers may be inserted to facilitate the bonding between two or more layers described above. In some embodiments, one or more layers can be added to change how the fingertip feels against the surface of the touch panel, the opacity, the abrasion rate, the resistance against dirt, the waterproof capabilities, anti-glare capabilities, etc. In certain embodiments, the DLC layer is deposited directly on the substrate with no intervening layers, such as adhesion or binder layers. Additionally, the surface layer may be formed directly on the DLC layer with no intervening layers. As described herein, other embodiments will utilize one or more intervening layers as appropriate to the particular implementation. The different layers in touch panel 100 can be combined using various assembly systems and methods described below.

While some embodiments where the touch surface is utilized as part of a non-screen touch device (e.g., a keyboard, a trackpad, a mouse), a high level of optical clarity may not be required. When a high level of optical clarity if needed for touchscreen devices (e.g., a tablet computer, a smartphone device where a graphical user interface may be presented through the touch surface of the device), the foggy, translucent, or partially opaque appearance on the touch surface can be minimized by building the surface topography (e.g., of the substrate, and/or the additional deposited films over the substrate) below the visible light wavelength. Moreover, optical clarity is influenced by the refractice index (n)—that is, the higher the n value, the more light is reflected (i.e., less optically clear). As glass has an n value ~1.6 and plastic has an n value ~1.4-1.6, with the same texture, plastic has better clarity and transparency compared to glass.

Figure 2:
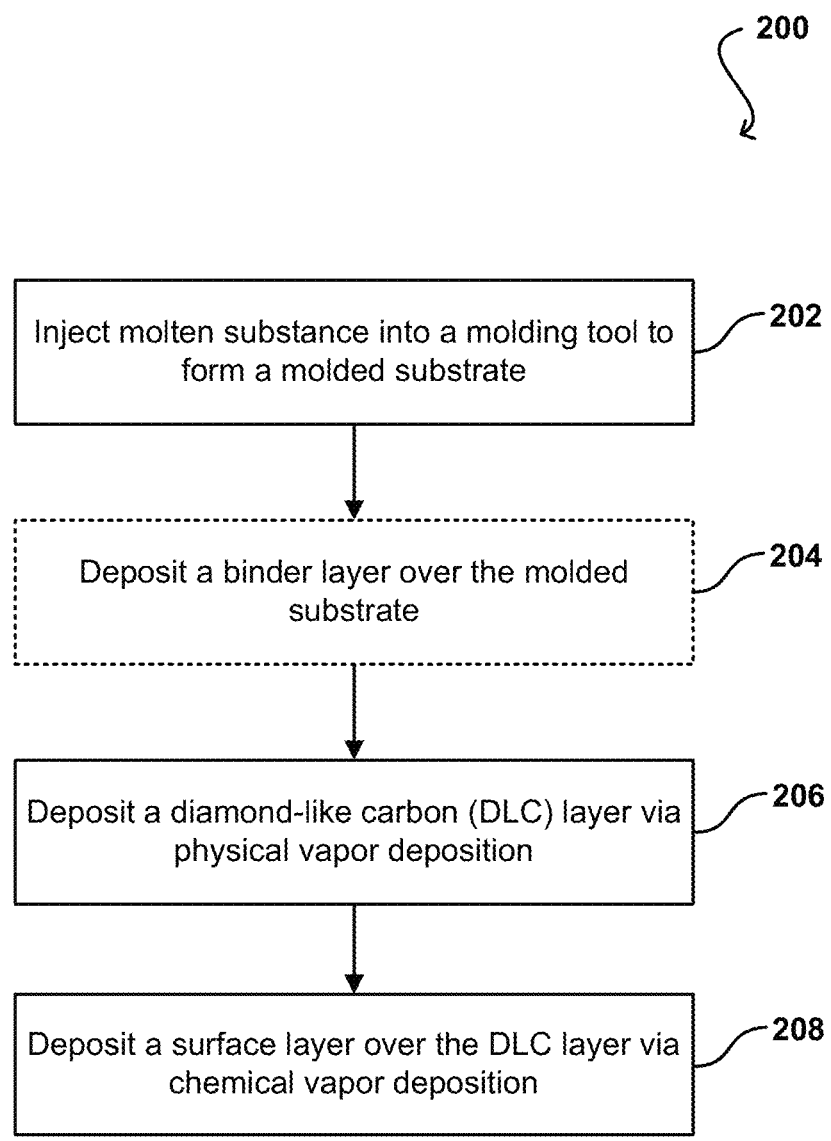
FIG. 2 illustrates an exemplary process of assembling a touch panel according to some embodiments of the present invention.

FIG. 2 illustrates an exemplary process 200 of assembling a touch panel according to some embodiments of the present invention. As described in FIG. 1, a touch panel can include a plastic substrate, a DLC layer, a surface layer, and various additional layers. Not every block described in process 200 must be performed to produce touch panel in some embodiments while other embodiments may require additional steps. FIG. 2 can be described with reference to FIGS. 3-8. FIGS. 3-8 illustrate various stages in assembling a touch panel (e.g., touch panel 100 in FIG. 1) in accordance with some embodiments of the present disclosure. As described, the assembled touch panel can be coupled to components of an electronic device, such as a processory, memory, to form a touch-enabled device. The touch panel can be assembled using various techniques and a combination of materials in order to provide the desired feedback against a user's touch.

At block 202, molten plastic (also referred to as melting plastic) can be injected into a molding tool to form a plastic substrate. This injection molding process can be used to form the desired shape and texture for the plastic substrate. Molten plastic or melting plastic are terms typically used when the plastic's temperature is over the melting point of plastic such that the plastic has started to melt but is not entirely liquid. Different embodiments may use different substances to form the substrate of touch panel.

Figure 3:
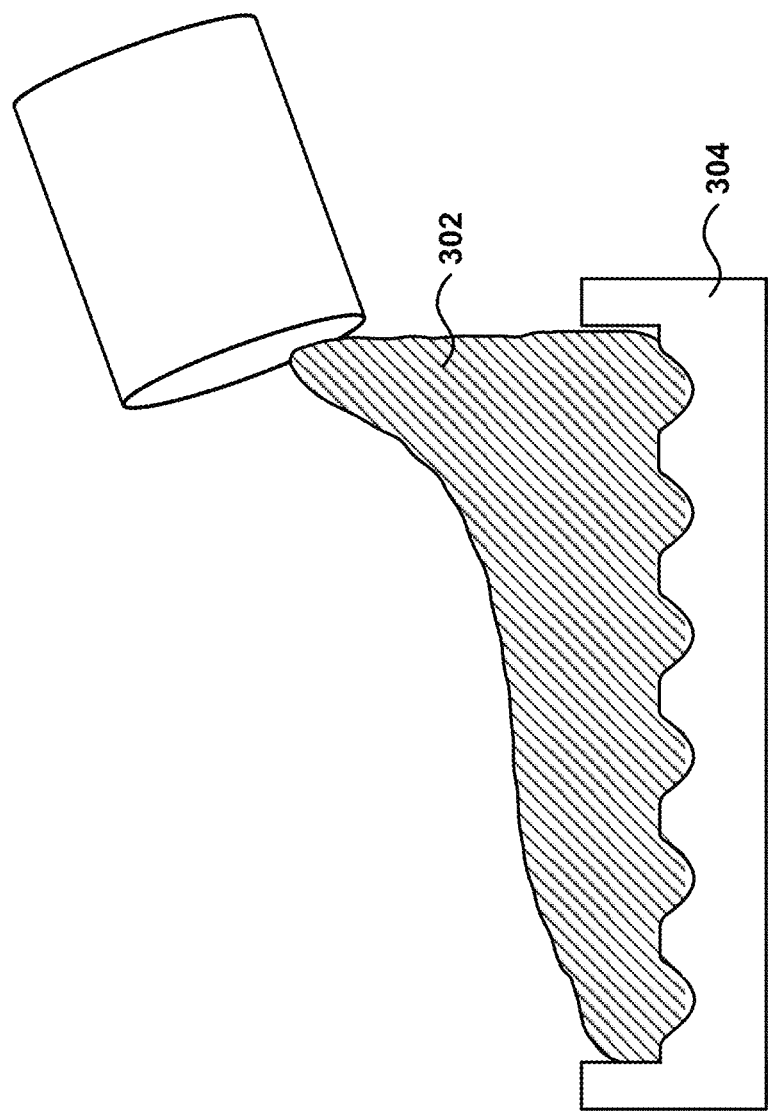
FIG. 3 illustrates an example in forming the substrate by injecting partially fluid substance into a molding tool.

FIG. 3 illustrates an example in forming the substrate by an injection molding process where the molten substance 302 is injected into a molding tool 304. Forming the substrate using plastic is advantageous because plastic is elastic, harder to break, and almost shatter-proof. In addition, plastic has a higher optical clarity and transparency compared to other materials such as glass. After the molten plastic is injected into the molding tool and cooled, the substrate can be formed and removed from the molding tool. Other processes such as compression molding, extrusion, imprinting, etching (e.g., chemical, laser, electrical discharge machining (EDM)), blasting, stamping (e.g., metal stamping), releasing paper, or using texture masters such as a molding tool, etc. to duplicate the topography, etc. can also be used in forming the substrate.

As shown in FIG. 3, the topography of one side of the substrate reflects a bumpy surface with consistent peaks and valleys. The surface topography of the substrate is the negative of the molding tool. Different embodiments may modify the molding tool to form a different texture on the plastic substrate to have different shapes or protrusions with different spacings in between the protrusions.

The dimensions, characteristics, and parameters of the substrate can be tuned by modifying the shape of the molding tool. The shape of the molding tool can be tuned based on the type of electronic device into which the touch panel may be integrated and based on the feeling that is desired to be produced against a user's fingertip. The molding tool can have a profile that enables the plastic substance to form a surface topography complementing the shape and design of the molding tool. In some embodiments, the surface roughness of the plastic substrate can be adjusted to fall within a desired range. As the properties of the materials can influence the final surface topography of the substrate, the type of material being molded, the molding tool's own properties, and the molding conditions have to be taken into account when the molding tool is being designed.

Figure 4A:
FIG. 4A illustrates a cross-sectional view of the formed substrate with the molded texture in accordance with some embodiments.

FIG. 4A illustrates a cross-sectional view of the formed substrate with the molded texture in accordance with some embodiments. As shown, the substrate has a surface topography of a series of protrusions with rounded peaks. The shapes of the protrusions, the depth of the protrusions, and the pitch among peaks of the protrusions can be adjusted based on the desired roughness value for producing the desired gliding effect. The surface topography of the substrate can be formed differently in some embodiments. For instance, some embodiments may use a chemical etching process to form the rounded shape peaks on the substrate. In some embodiments, the substrate can be coated with fine layers (e.g., a photo-resistant layer) and etched according to one or more grid patterns to produce the desired surface topography.

Figure 4B:
FIG. 4B illustrates a first perspective view of the formed substrate according to some embodiments of the present invention.
Figure 4C:
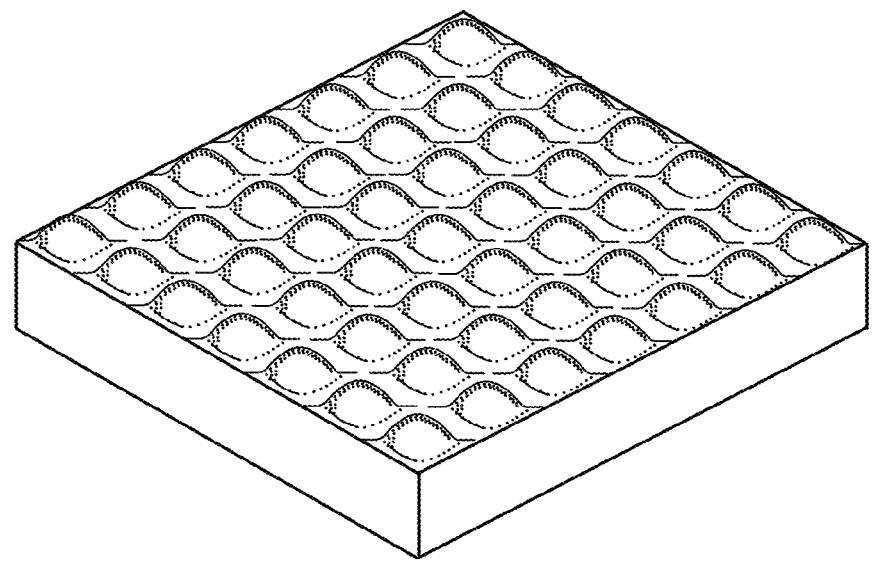
FIG. 4C illustrates a second perspective view of the formed substrate according to some embodiments of the present invention.
Figure 4D:
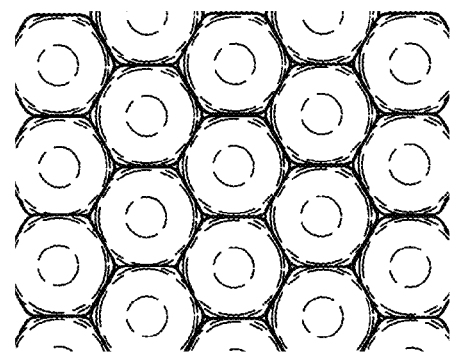
FIG. 4D illustrates a plan view of the formed substrate according to certain embodiments of the invention.

FIG. 4B illustrates a first perspective view of the formed substrate according to some embodiments of the present invention. FIG. 4C illustrates a second perspective view of the formed substrate according to some embodiments of the present invention. As shown, the formed substrate resembles eggs placed in an egg crate. FIG. 4D illustrates a plan view of the formed substrate according to certain embodiments of the invention. The pattern on the formed substrate may be consistent throughout in some embodiments. In one embodiment, the pattern may be random throughout the formed substrate.

Returning to process 200 in FIG. 2, at block 204, a uniform layer of binder layer can be deposited over the plastic substrate. In some embodiments, the binder layer can be deposited over the plastic substrate using the PVD process. The binder layer can be applied to facilitate the bonding between the DLC layer and the plastic substrate. In particular, a binder layer in some embodiments can foster an organic-inorganic bonding that provides enhanced adhesion between the two layers (e.g., a layer of organic plastic material and a layer of inorganic DLC material). Some embodiments may not need a layer of binder layer for the DLC layer to adhere properly and firmly to the plastic substrate. Process 200 may omit block 204 in some embodiments (as indicated by the dotted lines forming block 204).

Figure 5:
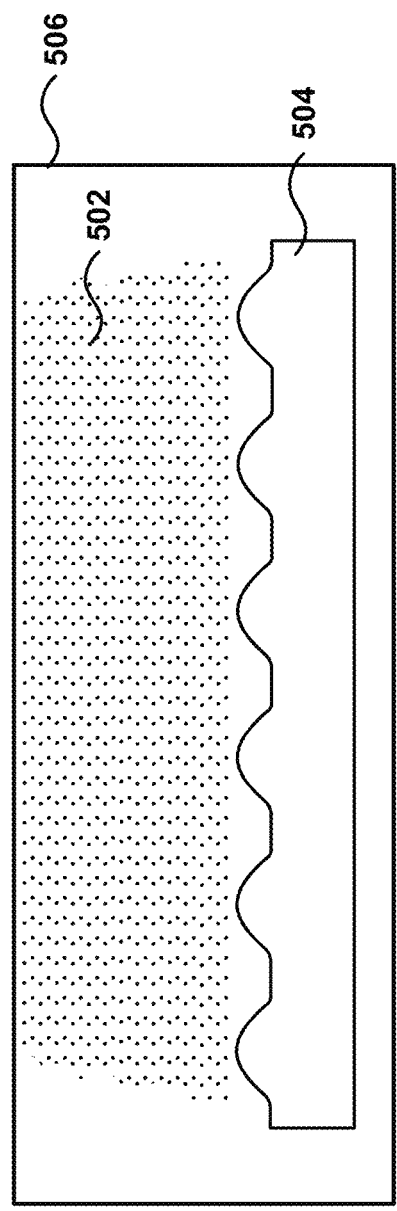
FIG. 5 illustrates an example of a deposition of the DLC over the substrate in accordance with some embodiments of the present invention.

At block 206, a thin film of DLC can be deposited e.g., via a PVD method. In some embodiments, a uniform layer of DLC can be deposited over the binder layer. In some instances, a binder layer may not be deposited over the plastic substrate. The DLC layer can be then be directly deposited over the plastic substrate. FIG. 5 illustrates an example of a deposition of DLC 502 on top of a substrate 504 to form a DLC coating over substrate 504 in accordance with some embodiments of the present invention. In this example, DLC 502 is deposited over substrate 504 via a PVD process where plastic substrate 504 can be placed in a plasma oven 506 while a consistent layer of DLC is deposited over plastic substrate 504. The thin, consistent DLC layer is deposited over the substrate to ensure that the topography or surface profile of the plastic substrate is closely replicated.

In some instances, the portions deposited over the valleys of the surface may smooth out such that the valleys may have a slightly thicker layer of DLC compared to the portions deposited over the peaks. In this example, 100 nm of PVD coating is deposited over the plastic substrate. A consistent 100 nm layer of DLC may track the profile of the plastic substrate. Due to the rigid properties of the DLC that is deposited over the plastic substrate, only a thin layer is needed to provide protection on the contours of the plastic substrate. Although a PVD process is used to deposit a thin film of DLC over the plastic substrate in this instance, many other types of deposition or coating methods can be used in some embodiments.

Figure 6A:
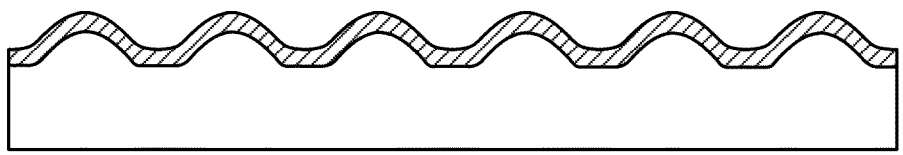
FIG. 6A illustrates a cross-sectional view of the DLC layer over the substrate.
Figure 6B:
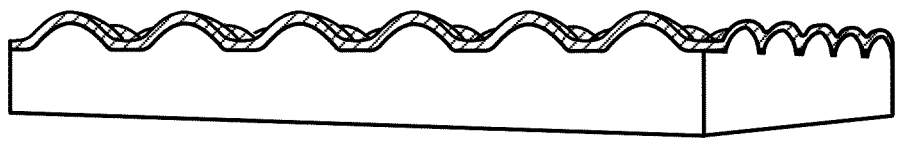
FIG. 6B illustrates a first perspective view of the DLC layer deposited over the plastic substrate.
Figure 6C:
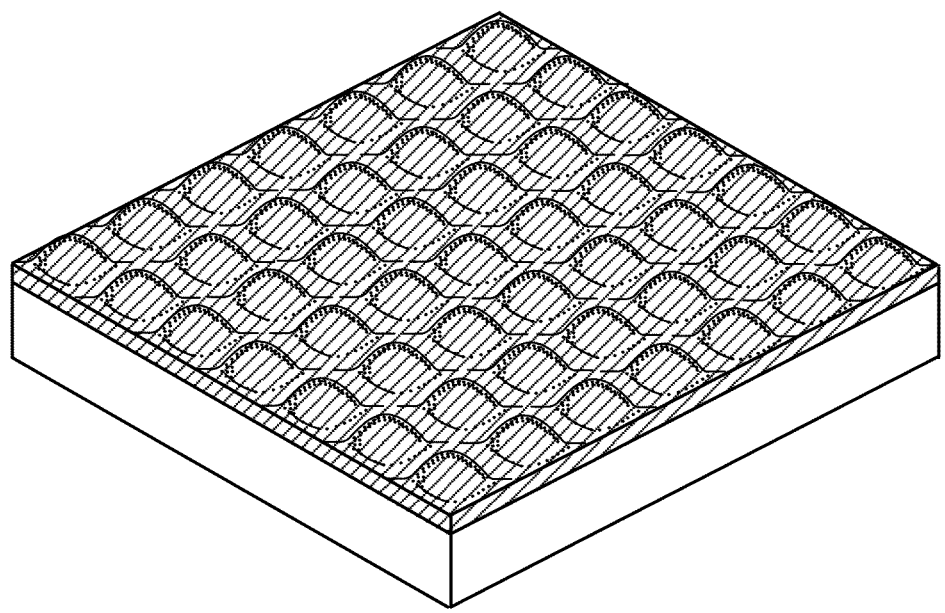
FIG. 6C illustrates a second perspective view of the DLC layer deposited over the plastic substrate.

FIG. 6A illustrates a cross-sectional view of the DLC layer over the substrate. FIG. 6B illustrates a first perspective view of the DLC layer deposited over the plastic substrate. FIG. 6C illustrates a second perspective view of the DLC layer deposited over the plastic substrate. As can be seen in these figures, the DLC layer (the shaded portion) is a uniform layer deposited over the plastic substrate such that the surface topography of the plastic substrate is maintained.

The DLC layer is a layer of high hardness and is highly resistant to wear and abrasion. In some embodiments, the DLC layer is comprised of silicon carbide (SiC). SiC is a chemical compound of carbon and silicon that has high hardness, high strength, low thermal expansion, high thermal conductivity, and various other properties suitable for maintaining a texture of the object over which the compound is deposited. In some embodiments, a plastic substrate with a molded texture cannot maintain its texture upon repeated wear. Thus, a thin DLC layer can be deposited over the plastic substrate to help maintain the surface topography of the plastic substrate and minimize damage to the plastic substrate from grease and debris that can affect the roughness of the surface texture.

In certain embodiments, the layer of DLC can be deposited over either the plastic substrate or the binder layer via a PVD process as described above. The PVD process allows the DLC layer deposition to produce a fairly accurate replica of the original plastic texture. The PVD process produces a near uniform thickness and therefore is a high fidelity replica of the original plastic texture. Since the DLC layer maps closely to the original surface topography of the plastic substrate, the roughness of the surface texture can be carried through the DLC layer. In some embodiments, the roughness average value over the DLC layer can be between 0.3 µm-0.6 µm. Using some methods such as a standard coating method may not be able to produce a precise surface topographic replica due to the thickness of the DLC layer (e.g., over 5 µm) that ends up being deposited using such methods.

In some embodiments, only a very thin DLC layer is needed to be deposited over the plastic substrate in order to serve as protection to the surface profile of the plastic substrate. Some embodiments deposit a DLC layer with a thickness between 10 nm-500 nm. The DLC layer can be cured to ensure that the coating is solid before additional layers are deposited over the DLC layer. Different embodiments may deposit the layer of DLC differently. The application method may be dependent upon the composition of the DLC layer being deposited and/or the composition of the plastic substrate or the binder layer to which the DLC layer is being bound.

Returning to process 200 in FIG. 2, at block 208, a surface layer can be deposited over the DLC layer. In certain embodiments, the surface layer can have a low coefficient of friction component, such as polytetrafluoroethylene (PTFE) or other fluorinated polymers. As described, the surface layer can be comprised of low surface energy fluoro-/silicon-rich molecules. In some embodiments, the composition of the surface layer can be adjusted to minimize the surface energy such that a nice and smooth touching/gliding feeling of the finger against the surface layer can be achieved. Surface layer can have a surface energy below a maximum threshold value in order for the touch feeling against the surface of the panel not to feel rough or abrasive.

Figure 7:
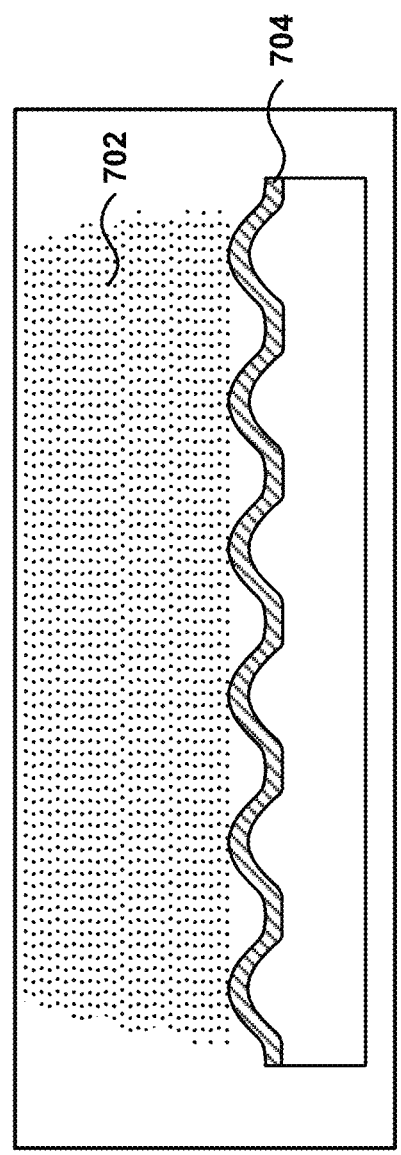
FIG. 7 illustrates a deposition of the surface layer over the DLC layer via a CVD process in accordance with some embodiments of the invention.

The surface layer can be deposited using a CVD process such that the fluoro-/silicon-rich molecules chemically bonds to the DLC layer. FIG. 7 illustrates a deposition of a surface layer substance 702 over a DLC layer 704 via a CVD process in accordance with some embodiments of the invention. In some embodiments, a thin surface layer is deposited with a thickness between 1 nm-100 nm. As described, the surface layer can have a low surface energy level that further reduces the friction further relative to the DLC layer (that already has fairly low surface energy).

Figure 8A:
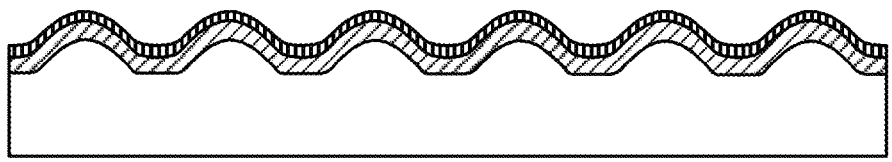
FIG. 8A illustrates a cross-sectional view of the surface layer deposited over the DLC layer of the touch panel in accordance with some embodiments.
Figure 8B:
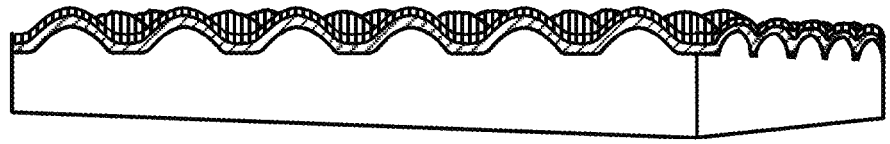
FIG. 8B illustrates a first perspective view of the surface layer deposited over the DLC layer of the touch panel in accordance with certain embodiments.
Figure 8C:
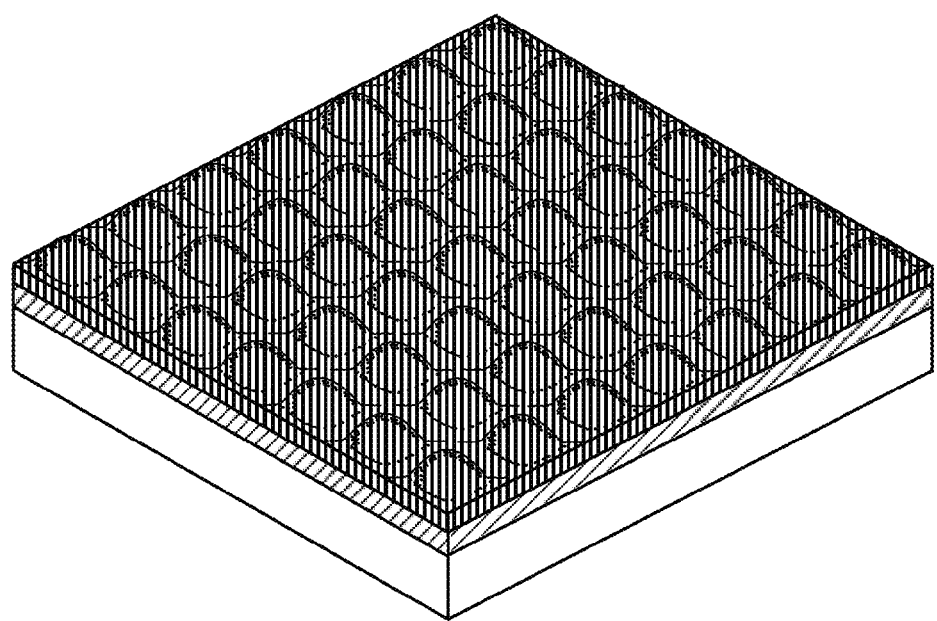
FIG. 8C illustrates a second perspective view of the surface layer deposited over the DLC layer of the touch panel in accordance with certain embodiments.

FIG. 8A illustrates a cross-sectional view of the surface layer deposited over the DLC layer of the touch panel in accordance with some embodiments. FIG. 8B illustrates a first perspective view of the surface layer deposited over the DLC layer of the touch panel in accordance with certain embodiments. FIG. 8C illustrates a second perspective view of the surface layer deposited over the DLC layer of the touch panel in accordance with certain embodiments.

Figure 9:
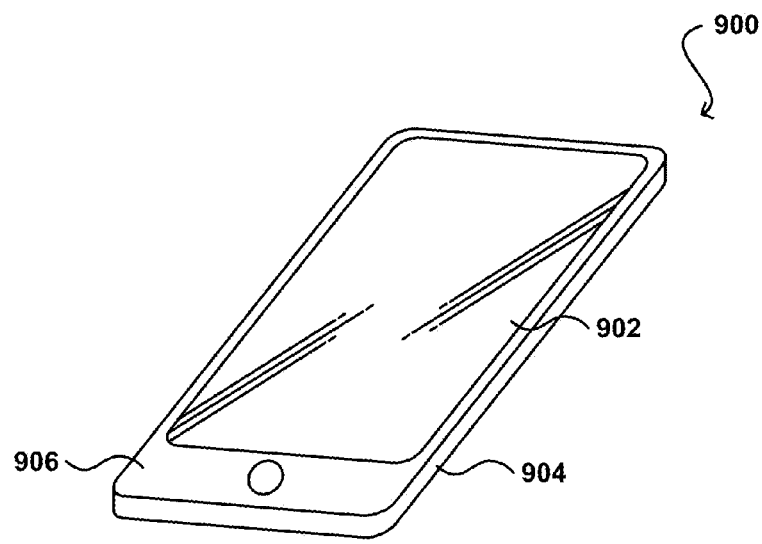
FIG. 9 illustrates an electronic device that can be used in accordance with various embodiments.

FIG. 9 illustrates an electronic device 900 that can be used in accordance with various embodiments. In this example, a touch panel 902 has been incorporated and has become part of electronic device 900. Although a portable computing device (e.g., a smartphone, a tablet computer, an electronic book reader) is shown, it should be understood that any device capable of receiving and processing input can be used in accordance with various embodiments described herein. The devices can include, for example, desktop computers, all-in-one computers, touch-enabled monitors, cellular phones, portable media players, laptop computers, personal data assistants (PDAs), video gaming consoles or controllers, or any other device with a touchscreen panel, not limited to any particular form factor. In certain embodiments, electronic device 900 can be a mouse, a track pad, a keyboard device, or any similar device with a touch-enabled or touch-sensitive surface.

In this example, electronic device 900 can include a housing 904 that includes a display panel 902 on side 906. In some embodiments, display panel 902 can display information to a user. Display panel 902 can be touch-sensitive or touch-enabled such that user input may be received via display panel 902. In some embodiments, input from the user may be received via a user interface displayed via display panel 902. In one embodiment, display panel 902 can have a thickness of 1 mm or less. Display panel 902 can be constructed using similar materials and in a similar manner to embodiments described above.

Figure 10A:
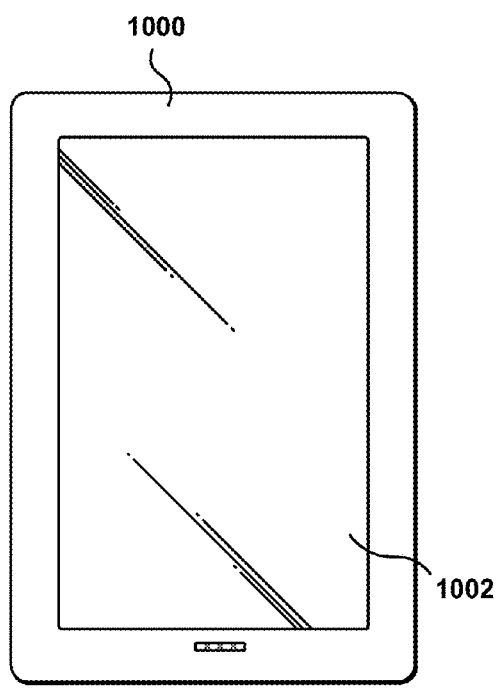
FIG. 10A illustrates a front view of an example electronic device that can be used in accordance with various embodiments.
Figure 10B:
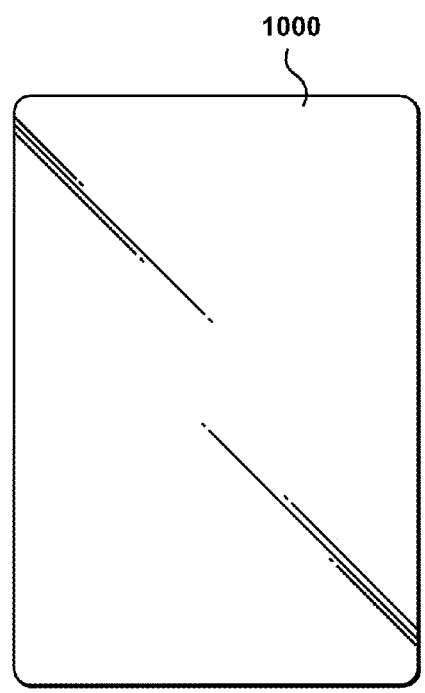

FIGS. 10A and 10B illustrate front and back views, respectively, of an example electronic device 1000 that can be used in accordance with various embodiments. Electronic device 1000 has a display screen 1002 that can display information to a viewer facing display screen 1002. In this example, touch surface 902 and 1002 similar to panel 100 in FIG. 1 have been integrated into electronic devices 900 and 1000 such that only a portion of panel 100 (e.g., surface layer 106 in FIG. 1) can be visible to a user of the electronic device. In some embodiments, the surface layer (e.g., surface layer 106 in FIG. 1) of the panel (e.g., panel 100 in FIG. 1) can be disposed on an exterior portion of the electronic device.

FIG. 11 illustrates a set of components that can be incorporated into exemplary system 1100 according to some embodiments. As shown, system 1100 can include one or more processing units 1105, storage subsystems 1110, input device 1115, output devices 1120, network interface 1125, and communication buses 1130. System 1100 may further include additional systems (e.g., audio systems, photovoltaic elements) that are not shown or discussed to prevent obfuscation of the novel features described herein. Similarly, some systems 1100 may include fewer systems as required by design.

Processing unit(s) 1105 can include a single processor, which can have one or more cores, or multiple processors. In some embodiments, processing unit(s) 1105 can include a general-purpose primary processor as well as one or more special-purpose co-processors such as graphics processors, digital signal processors, or the like. In some embodiments, some or all processing units 1105 can be implemented using customized circuits, such as application specific integrated circuits (ASICs) or field programmable gate arrays (FPGAs). In some embodiments, such integrated circuits execute instructions that are stored on the circuit itself. In other embodiments, processing unit(s) 1105 can execute instructions stored in storage subsystem 1110.

Storage subsystem 1110 can include various memory units such as a system memory, a read-only memory (ROM), and a permanent storage device. The ROM can store static data and instructions that are needed by processing unit(s) 1105 and other modules of electronic device 1100. The permanent storage device can be a read-and-write memory device. This permanent storage device can be a non-volatile memory unit that stores instructions and data even when computer system 1100 is powered down. Some embodiments can use a mass-storage device (such as a magnetic or optical disk or flash memory) as a permanent storage device. Other embodiments can use a removable storage device (e.g., a floppy disk, a flash drive) as a permanent storage device. The system memory can be a read-and-write memory device or a volatile read-and-write memory, such as dynamic random access memory. The system memory can store some or all of the instructions and data that the processor needs at runtime.

Storage subsystem 1110 can include any combination of computer readable storage media including semiconductor memory chips of various types (DRAM, SRAM, SDRAM, flash memory, programmable read-only memory) and so on. Magnetic and/or optical disks can also be used. In some embodiments, storage subsystem 1110 can include removable storage media that can be readable and/or writeable; examples of such media include compact disc (CD), read-only digital versatile disc (e.g., DVD-ROM, dual-layer DVD-ROM), read-only and recordable Blue-Ray® disks, ultra density optical disks, flash memory cards (e.g., SD cards, mini-SD cards, micro-SD cards, etc.), magnetic "floppy" disks, and so on. The computer readable storage media do not include carrier waves and transitory electronic signals passing wirelessly or over wired connections.

In some embodiments, storage subsystem 1110 can store one or more software programs to be executed by processing unit(s) 1105, such as an application 1135. As mentioned, "software" can refer to sequences of instructions that, when executed by processing unit(s) 1105 cause computer system 1100 to perform various operations, thus defining one or more specific machine implementations that execute and perform the operations of the software programs. The instructions can be stored as firmware residing in read-only memory and/or applications stored in magnetic storage that can be read into memory for processing by a processor. Software can be implemented as a single program or a collection of separate programs or program modules that interact as desired. Programs and/or data can be stored in non-volatile storage and copied in whole or in part to volatile working memory during program execution. From storage subsystem 1110, processing unit(s) 1105 can retrieve program instructions to execute and data to process in order to execute various operations described herein.

A user interface can be provided by one or more user input devices 1115, display device 1120, and/or and one or more other user output devices (not shown). Input devices 1115 can include any device via which a user can provide signals to computing system 1100; computing system 1100 can interpret the input signals or gestures as indicative of particular user requests or information. In various embodiments, input devices 1115 can include any or all of a keyboard touch pad, touch screen, mouse or other pointing device, scroll wheel, click wheel, dial, button, switch, keypad, microphone, and so on.

Output devices 1120 can display images generated by electronic device 1100 and can include various image generation technologies, e.g., a cathode ray tube (CRT), liquid crystal display (LCD), light-emitting diode (LED) including organic light-emitting diodes (OLED), projection system, or the like, together with supporting electronics (e.g., digital-to-analog or analog-to-digital converters, signal processors, or the like). Some embodiments can include a device such as a touchscreen that function as both input and output device. In some embodiments, other user output devices can be provided in addition to or instead of display 1120. Examples include indicator lights, speakers, tactile "display" devices, printers, and so on.

In some embodiments, an output device 1120 (also referred to as a display 1120) can provide a graphical user interface, in which visible image elements in certain areas of display 1120 are defined as active elements or control elements that the user selects using user input devices 1115. For example, the user can manipulate a user input device to position an on-screen cursor or pointer over the control element, then click a button to indicate the selection. Alternatively, the user can touch the control element (e.g., with a finger or stylus) on a touchscreen device. In some embodiments, the user can speak one or more words associated with the control element (the word can be, e.g., a label on the element or a function associated with the element). In some embodiments, user gestures on a touch-sensitive device can be recognized and interpreted as input commands; these gestures can be but need not be associated with any particular array in display 1120. Other user interfaces can also be implemented.

Network interface 1125 can provide voice and/or data communication capability for electronic device 1100. In some embodiments, network interface 1125 can include radio frequency (RF) transceiver components for accessing wireless voice and/or data networks (e.g., using cellular telephone technology, advanced data network technology such as 3G, 4G or EDGE, WiFi (IEEE 802.11 family standards, or other mobile communication technologies, or any combination thereof), GPS receiver components, and/or other components. In some embodiments, network interface 1125 can provide wired network connectivity (e.g., Ethernet) in addition to or instead of a wireless interface. Network interface 1125 can be implemented using a combination of hardware (e.g., antennas, modulators/demodulators, encoders/decoders, and other analog and/or digital signal processing circuits) and software components.

Bus 1130 can include various system, peripheral, and chipset buses that communicatively connect the numerous internal devices of electronic device 1100. For example, bus 1130 can communicatively couple processing unit(s) 1105 with storage subsystem 1110. Bus 1130 also connects to input devices 1115 and display 1120. Bus 1130 also couples electronic device 1100 to a network through network interface 1125. In this manner, electronic device 1100 can be a part of a network of multiple computer systems (e.g., a local area network (LAN), a wide area network (WAN), an Intranet, or a network of networks, such as the Internet. Any or all components of electronic device 1100 can be used in conjunction with the invention.

Some embodiments include electronic components, such as microprocessors, storage and memory that store computer program instructions in a computer readable storage medium. Many of the features described in this specification can be implemented as processes that are specified as a set of program instructions encoded on a computer readable storage medium. When these program instructions are executed by one or more processing units, they cause the processing unit(s) to perform various operation indicated in the program instructions. Examples of program instructions or computer code include machine code, such as is produced by a compiler, and files including higher-level code that are executed by a computer, an electronic component, or a microprocessor using an interpreter.

It will be appreciated that computer system 1100 is illustrative and that variations and modifications are possible. Computer system 1100 can have other capabilities not specifically described here (e.g., global positioning system (GPS), power management, one or more cameras, various connection ports for connecting external devices or accessories, etc.). Further, while computer system 1100 is described with reference to particular blocks, it is to be understood that these blocks are defined for convenience of description and are not intended to imply a particular physical arrangement of component parts. Further, the blocks need not correspond to physically distinct components. Blocks can be configured to perform various operations, e.g., by programming a processor or providing appropriate control circuitry, and various blocks might or might not be reconfigurable depending on how the initial configuration is obtained. Embodiments of the present invention can be realized in a variety of apparatus including electronic devices implemented using any combination of circuitry and software.

Experimental Data

Additional advantages of a DLC-coated touch surface can include minimized jerking movement and noise while preserving precision in touch control. For example, a low speed and hard-pressing motion such as a highlighting motion can be performed and detected. A friction test of textured ABS vs. DLC-treated ABS can be performed using the following testing conditions:

Instrument: Standard Friction Tester,
Contact material: 10 mm*10 mm TPSiV
Loading: 200 g In comparison with non-treated ABS surface without DLC, the table below shows that with a higher Ra value, the static friction coefficient for DLC-treated ABS is consistently lower than the static friction coefficient for non-treated ABS surface. Hence, by using DLC-treated ABS, the friction force can be improved, which can be reflected in the last column of the table indicating the change of static friction coefficient between the non-treated ABS surface and the DLC-treated ABS.

| Roughness (Ra) | Static friction coefficient Pristine plastic | Static friction coeffiecient with DLC | Change of Static friction coefficient |
|---|---|---|---|
| 0.5 | 0.921 | 0.611 | −0.31 |
| 1.0 | 0.846 | 0.589 | −0.257 |
| 1.5 | 0.634 | 0.519 | −0.115 |
| 2.0 | 0.775 | 0.462 | −0.331 |
| 2.5 | 0.788 | 0.41 | −0.378 |
| 3.0 | 0.758 | 0.397 | −0.363 |

FIGS. 12A and 12B illustrate the reduction of the jerking motion when a precision touch is applied against DLC-treated ABS vs. non-treated ABS. The dynamic friction force measurement can be compared between non-treated textured ABS surface without DLC against DLC treated ABS. FIG. 12A illustrates the friction profile of a sample without DLC coating that is being assembled under the testing conditions. The friction profile for the sample without DLC coating reflects large amounts of jagged and jerky movements. FIG. 12B illustrates the friction profile of sample with DLC coating that is being assembled under the testing conditions. The friction profile for the sample with the DLC coating reflects a smooth movement that becomes near constant.

What is claimed is:

1. A touch surface comprising:
a substrate for the touch surface, the substrate having a first surface and a second surface opposite thereto, the first surface having a plurality of protrusions disposed thereon, wherein the plurality of protrusions are part of the substrate and are made of the same material as the substrate;
a diamond-like carbon layer (DLC) coated over the plurality of protrusions on the first surface of the substrate; and
a surface layer disposed on the DLC layer.

2. The apparatus of claim 1, wherein the substrate comprises a plastic material.

3. The apparatus of claim 1, wherein the substrate includes a Ra value ranging from 0.1 μm-5.0 μm and a Rz value ranging from 0.1 μm-10 μm.

4. The apparatus of claim 1, wherein the DLC layer comprises a PVD layer.

5. The apparatus of claim 1, wherein the DLC layer lines the contours of the plurality of protrusion disposed on the first surface of the substrate.

6. The apparatus of claim 1, wherein a surface energy of the surface layer is lower than a surface energy of the DLC layer.

7. The apparatus of claim 1, wherein the surface layer comprises fluoro- or silicon-rich molecules.

8. An electronic device comprising:
a device housing that defines a shape and a size of the electronic device;
a processor positioned within the device housing; and
a touch panel coupled to the device housing, the touch panel including a substrate, a diamond-like carbon (DLC) layer, and a surface layer configured to receive user input directed at the electronic device, the substrate having a plurality of protrusions that include the same material as the substrate.

9. The electronic device of claim 8, wherein a surface topology of one side of the substrate includes a plurality of protruding portions evenly distributed across the side of the substrate.

10. The electronic device of claim 8, wherein the DLC layer is disposed on the substrate and the surface layer is disposed on the DLC layer.

11. The electronic device of claim 8, wherein the DLC layer includes a thickness ranging from 10 nm-500 nm.

12. The electronic device of claim 8, wherein the surface layer is characterized by a coefficient of friction less than a coefficient of friction characterizing the DLC layer.

13. The electronic device of claim 8, wherein a Ra value of the surface layer is substantially equal to a Ra value of the substrate.

14. A method comprising:
providing a substrate for a touch panel, the substrate including a first surface and a second surface opposite thereto, the first substrate including a plurality of protruding portions disposed thereon, wherein the plurality of protrusions are part of the substrate and are made of the same material as the substrate;
depositing a diamond-like carbon (DLC) layer over the first surface of the substrate; and
depositing a surface layer over the DLC layer.

15. The method of claim 14, wherein the DLC layer is deposited over the first surface of the substrate via a physical vapor deposition (PVD) process.

16. The method of claim 14, wherein the surface layer is deposited over the DLC layer via a chemical vapor deposition (CVD) process.

17. The method of claim 14, wherein the substrate comprises plastic.

18. The method of claim 14, further comprising depositing, using a PVD process, a binder layer over the first surface of the substrate prior to depositing the DLC layer over the first surface of the substrate.

19. The method of claim 14, wherein the DLC layer and the surface layer are deposited over the substrate such that the topographic structure of the surface of the substrate is maintained.

20. The method of claim 14, wherein the surface layer is characterized by a thickness ranging from 1 nm-100 nm.

* * * * *